(12) United States Patent  
Corbin et al.

(10) Patent No.: US 7,103,814 B2  
(45) Date of Patent: Sep. 5, 2006

(54) TESTING LOGIC AND EMBEDDED MEMORY IN PARALLEL

(75) Inventors: William R. Corbin, Underhill, VT (US); Brian R. Kessler, Richmond, VT (US); Erik A. Nelson, Waterbury, VT (US); Thomas E. Obremski, So. Burlington, VT (US); Donald L. Wheater, West Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 68 days.

(21) Appl. No.: 10/065,503

(22) Filed: Oct. 25, 2002

(65) Prior Publication Data

US 2004/0083412 A1    Apr. 29, 2004

(51) Int. Cl.  
*G01R 31/28* (2006.01)

(52) U.S. Cl. ..................... 714/726; 714/733

(58) Field of Classification Search ........... 714/724, 714/726, 727, 729, 733, 738, 718, 719  
See application file for complete search history.

(56) References Cited

U.S. PATENT DOCUMENTS

| | | | |
|---|---|---|---|
| 3,961,251 A | 6/1976 | Hurley et al. | |
| 4,481,627 A | 11/1984 | Beauchesne et al. | |
| 5,436,910 A | 7/1995 | Takeshima et al. | |
| 5,535,164 A | 7/1996 | Adams et al. | |
| 5,663,965 A | 9/1997 | Seymour | |
| 5,680,543 A * | 10/1997 | Bhawmik | 714/30 |
| 5,892,721 A | 4/1999 | Kim | |
| 5,903,576 A | 5/1999 | Yoshiba | |
| 5,954,830 A | 9/1999 | Ternullo | |
| 5,987,635 A * | 11/1999 | Kishi et al. | 714/724 |
| 5,996,097 A | 11/1999 | Evans et al. | |
| 6,044,481 A | 3/2000 | Kornachuk et al. | |
| 6,111,800 A | 8/2000 | Allan et al. | |
| 6,122,762 A * | 9/2000 | Kim | 714/726 |
| 6,125,460 A | 9/2000 | Sim | |
| 6,324,107 B1 | 11/2001 | Allan et al. | |
| 6,430,718 B1 * | 8/2002 | Nayak | 714/727 |
| 6,587,979 B1 * | 7/2003 | Kraus et al. | 714/720 |
| 6,650,589 B1 * | 11/2003 | Clark | 365/226 |

* cited by examiner

*Primary Examiner*—James C. Kerveros  
(74) *Attorney, Agent, or Firm*—Michael J. LeStrange

(57) ABSTRACT

Technique to perform logic and embedded memory tests using logic scan chain testing procedures in parallel with memory built in self test (BIST). This is accomplished with a combination of voltage isolation between memory and logic segments, and isolation between logic and memory test clocks. A test algorithm is introduced to enable and disable the scan chain operation during BIST operation.

12 Claims, 3 Drawing Sheets

TESTING LOGIC AND EMBEDDED MEMORY IN PARALLEL

BACKGROUND OF THE INVENTION

Field of the Invention

The present invention generally relates to an apparatus for testing logic and embedded memory in a semiconductor integrated circuit device located on the same chip.

Recently, various types of semiconductor integrated circuit devices (hereinafter referred to as LSIs) with a variety of memory built-in structures have been put in practical use. For example, in order to attain a high speed data processing, a plurality of memories each with a small capacity are provided on the same substrate as data processing buffers, or a memory with a large capacity such a cache memory of a microprocessor is provided on the same substrate.

Therefore, not only increase of the scale of the LSI but also security for test coverage, decrease of an increasing test time, etc. in conducting a functional test of the LSI have become significant problems.

In general, an operation test of an internal combinational circuit including a logic circuit built in an LSI (namely, the so-called logic test) is carried out by supplying the LSI with a predetermined test vector for confirming the function of the LSI and by comparing an operational value in response to the test vector read from the LSI with an expected value. This is not, however, a very good method to secure the test coverage of the operation test with a small number of test vectors.

Accordingly, a flip-flop or the like built in an LSI is recently provided with a sequential circuit having a scan function, and a test by a scanning method using the sequential circuit has been occasionally adopted. The test by the scanning method (hereinafter referred to as the scan test) is described in, for example, "Digital Kairo No Kosho Shindan, vol. 1" by Kinoshita, et al., pp. 214–215, published by Kogaku Tosho K.K.). Furthermore, a memory test for a built-in memory in an LSI is carried out by conducting a data read/write test using a predetermined algorithm such as a marching algorithm and a checker algorithm.

However, the read/write test is not sufficient in the built-in memory. For example, even when the built-in memory has a memory cell structure of an RAM base, there is possibility of occurrence of a production problem such as data disappearance due to a leakage current in a specific memory cell. Therefore, a test for securing data hold during a predetermined time period is required to be conducted. Specifically, in this data holding test, a predetermined data is previously written in a memory, no data is written in or read from the memory for a predetermined period of time, and it is checked whether or not the written data is held after the predetermined period of time. The data holding test requires a holding period of several tens through several hundreds ms (milliseconds) during which no memory access is executed. This period is much longer than a general operation time of an LSI of several through several tens ns (nanoseconds).

As more LSI designs incorporate embedded memory it is necessary to develop testing techniques which will be efficient and speed up the time required for testing.

SUMMARY OF THE INVENTION

Accordingly, an object of the present invention is to provide parallel testing of LSI designs having both memory and logic components.

Another object is to optimize the test time without impacting test quality.

A further objective is to optimize the test time without constraints on the size of the chip.

A still further objective is to speed up test time required in each design.

Current test solutions for chips with both logic and embedded memory are not optimized for test time. A typical solution involves testing the logic and memory in serial This leads to wasted test time. For example, no logic testing is done during die pause portion of DRAM retention testing. Test time could be optimized if a solution existed that enabled parallel test of logic and embedded memory.

The present invention performs logic and embedded memory test in parallel. The basic concept of this invention is to provide the ability to perform logic scan testing in parallel with memory Built In Self Test (BIST). This is accomplished by:

(1) Voltage isolation between logic and memory segments
(2) Isolated logic and memory test clocks
(3) Scan bypass/isolation
(4) Test algorithm Voltage isolation enables independent voltage levels to be supplied to logic and memory segments during test. Memory and logic test often require different voltage levels during respective testing. Voltage isolation may be achieved in several ways: (a) separate Vdd planes (84) (i.e. off-chip), (b) voltage regulators (82) that generate each macro voltage level from an exiernal reference voltage. (c) a control feature in the BIST (81) engine that controls a reference to the voltage regulator for each macro, or (d) feedback (83) from the logic portion of the chip to the regulator to control voltage levels. It should be understood that other well known techniques exist in the field that could also be used in this system to provide voltage isolation such that the invention should not be limited to the examples listed above.

DETAILED DESCRIPTION OF PREFERRED EMBODIMENT

Figure 1:
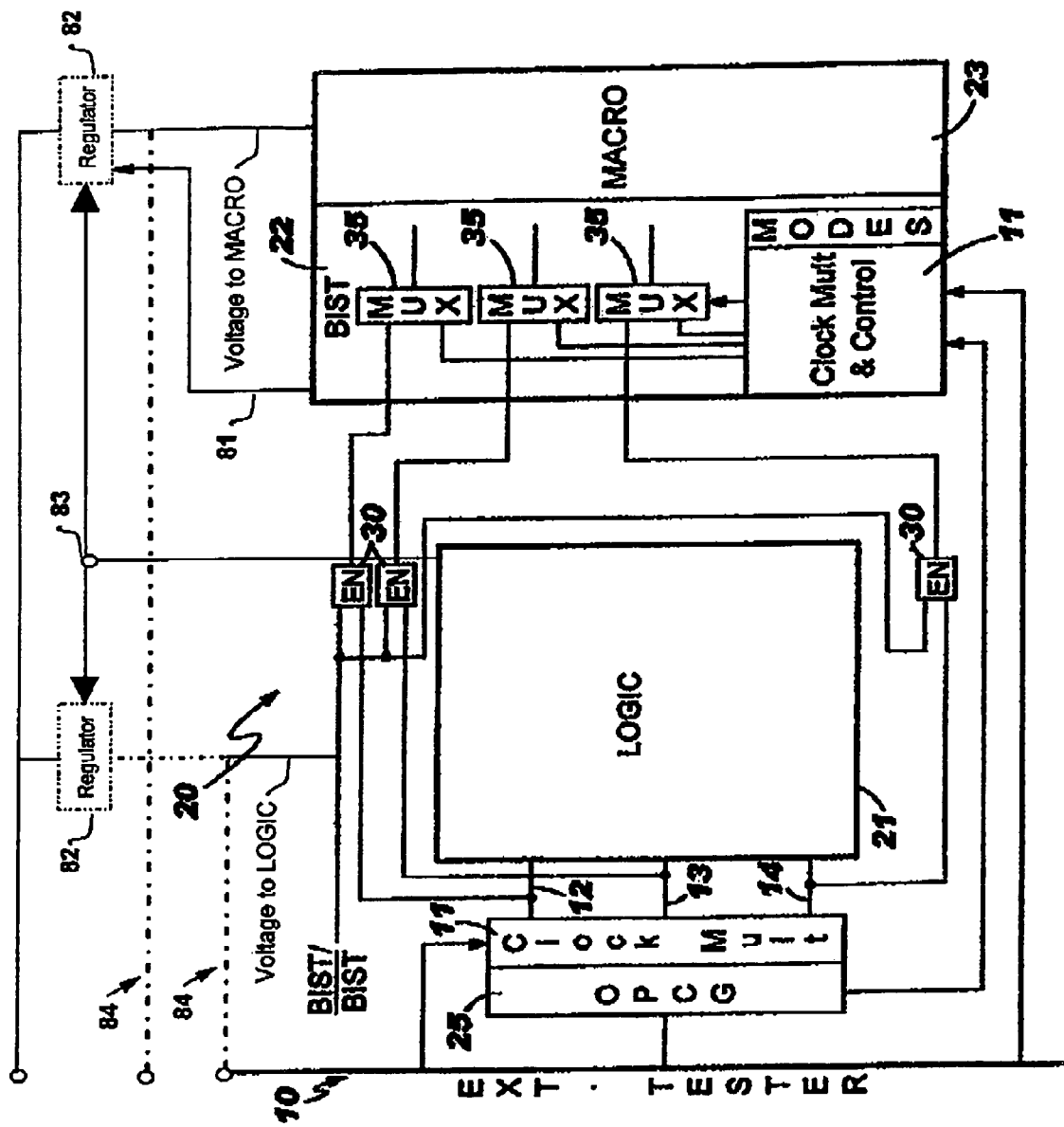
FIG. 1 is a block diagram of the present invention.

Attention is directed to FIG. 1 which illustrates apparatus for enabling parallel testing on chips containing both logic and embedded memory. An essential element of the apparatus is to provide independent clocking of the logic and the memory test sequences. The independent clocking capability allows logic test pattern to be loaded and results unloaded independently of the memory test clock requirements. The clocking signal may be supplied by an external tester 10 to a clock multiplier and control circuit 11. The clock multiplier circuit 11 provides test clock signals 12, 13, 14 to provide independent clock signals the logic portion 21 and a BIST on a memory macro portion 23 of the chip under test 20.

In an alternative arrangement the clock signal from the tester 10 may be applied to an on product clock generator 25 which could generate clock signals 12, 13, 14 directly or provide a signal to the clock multiplier control circuit 11 which would in turn generate the clock signals 12, 13, 14.

The use of either arrangement would provide sufficient isolation of the clock signals to be applied to the chip under test.

As yet another alternative the tester 10 could provide all the clocks separately to the chip, this implementation while the simplest has the disadvantage of using a lot of I/O for test purposes only.

A built in self test system, circuits not shown; generate the test signals for the memory macro portion 23. Circuits 30 (clocking isolation elements) disable the test clocks to the memory macro(s) during BIST testing so that the "Clock Mult & Control" circuit 11 block can generate BIST test clocks based on the reference frequency input from the tester. (or alternatively from the OPCG ckt (25). The control circuit 11 also generates the control signal to the multiplexer 35 which selects the test clocks generated by the "Clock Mult & Control" block during the operation of the BIST. This enables independent test clocks to be applied to the memory and logic segments. During scan operations, the clocks enable the global test clocks so that BIST contents can be properly unloaded (scanned out) as described hereinafter.

According to the present invention, part of the time (when testing the memory BIST engine) the logic and memory both get clocked at the same time, then to speed up test, once the BIST has been verified, the clocking to the BIST engine is separated (as memory testing follows a different clocking sequence than the logic) and the testing of the memory can proceed while logic testing also takes place.

Figure 2:
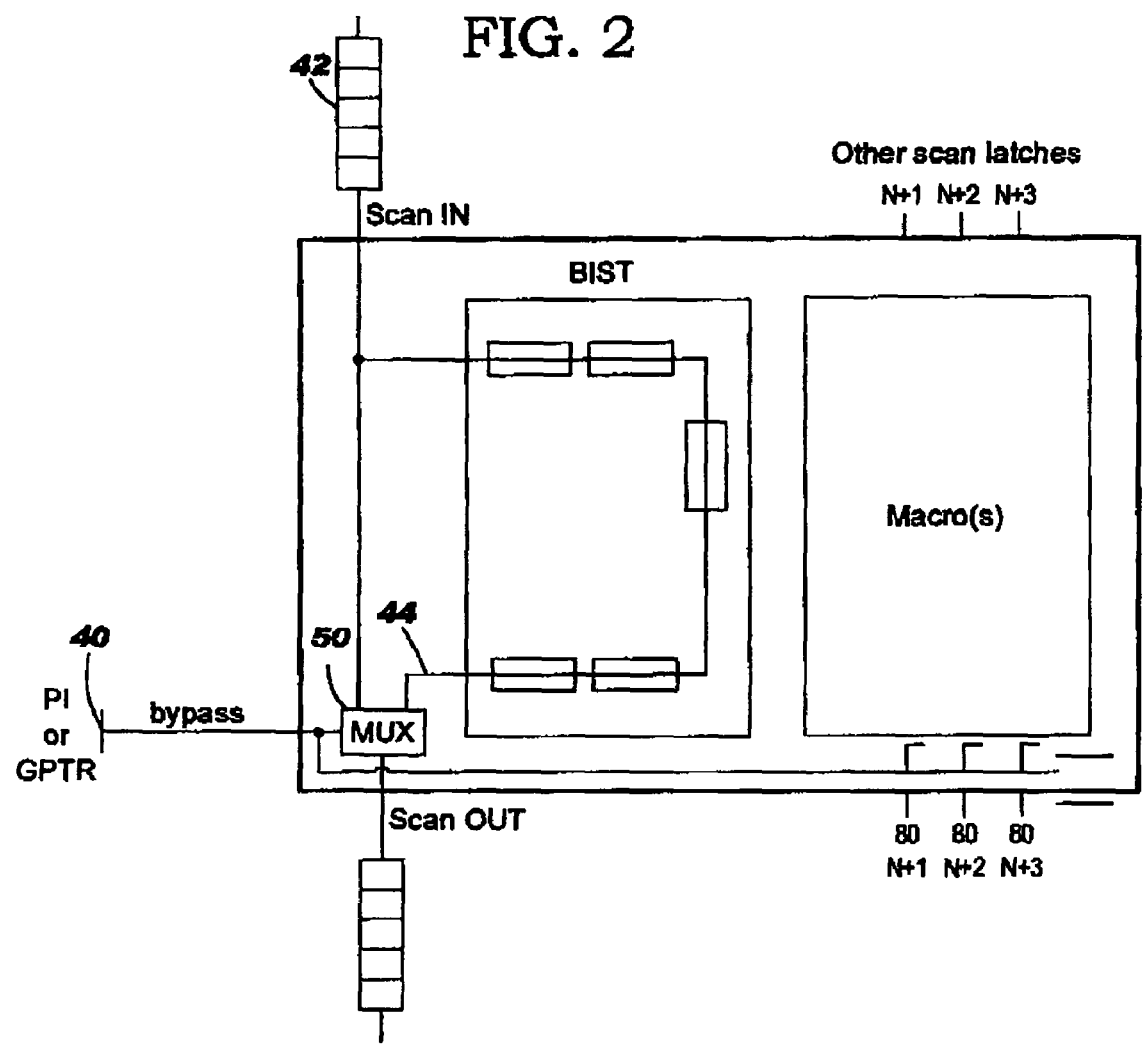
FIG. 2 is a block diagram of another aspect of the present invention.

Scan bypass enables isolation of memory macros from the scan chains. This isolation is necessary during parallel test in order to load logic test patterns and unload test results via scan chains while the BIST engine is running. FIG. 2 illustrates the preferred embodiment for scan bypass/isolation. Either a primary input 40 or general purpose test register latch 40 may be used to provide a control signal (labeled "bypass") to a multiplexer 50 (scan chain bvnass isolation element) in each memory segment. The scan chain is used to load the BIST pattern. Once the BIST operation pattern is loaded from input 42. the control signal from the test latch 40 puts the MUX 30 into bypass mode by selecting the scan in signal, not the output 44 of the BIST engine. Logic patterns can then be loaded and results unloaded via the scan chains while the BIST engine is running. When the BIST is done, the bypass mux is taken out of the bypass mode and the results can be unloaded via the scan chains using the clocking scheme described earlier.

Figure 3:
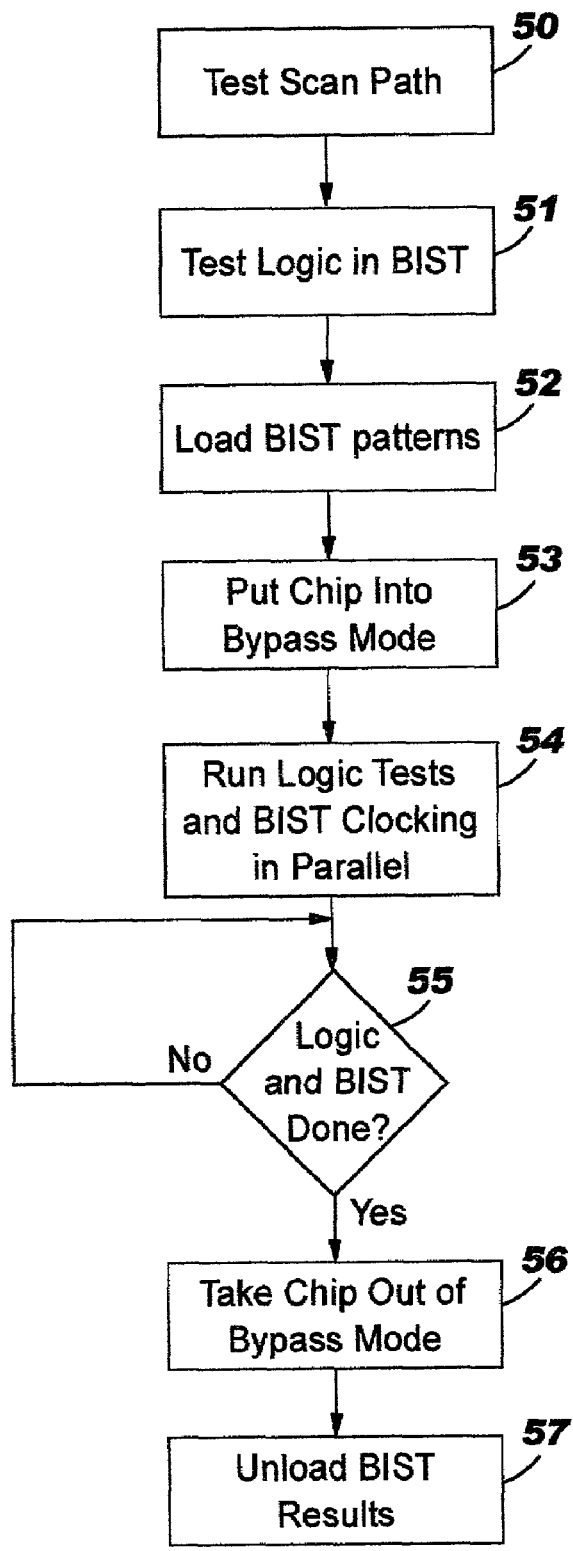
FIG. 3 is a flow diagram of the present invention.

FIG. 3 illustrates a high-level flow of the test algorithm. Once the scan chain 50 and BIST logic integrity 51 have been verified, BIST patterns are loaded via scan chains 52. The chip is not in bypass mode when loading BIST patterns and clocking is controlled by the global test clocks (not local BIST clocks). Once the BIST patterns are loaded, the chip is put into bypass mode 53 (memory macros are isolated from the scan chains) via the 'bypass signal' shown in FIG. 2. In bypass mode, independent BIST test clocks are generated by the process described in section 2. Logic test patterns are loaded and results unloaded via scan chains in parallel with the BIST engine running 54. This is accomplished both isolated clocking and scan isolation from the memory macros. Voltage isolation may also be used during logic/BIST parallel testing. When BIST and logic tests are complete 55, the chip is taken out of bypass mode 56 and global test clocks again control the memory macros, BIST result are unloaded via scan chains 57. This process is repeated for all logic/BIST sequences.

it will be apparent to those skilled in the art that various modifications and variations can be made in the parallel test circuit for the memory device of the present invention without departing from the spirit or scope of the invention. Thus, it is intended that the present invention cover the modifications and variations of this invention provided they come within the scope of the appended claims and their equivalents.

What is claimed is:

1. Apparatus for performing simultaneous tests of logic and memory for semiconductor devices having logic and memory macro with BIST circuits, comprising:
    voltage isolation elements for logic and memory circuits having individual separate isolated independent clocking paths to each logic and memory macro circuits;
    a clocking system including clocking isolation elements for logic and memory circuits; and
    scan chain bypass isolation elements to enable and disable the BIST which tests the memory macro circuits while logic scan chain results are read out.

2. The apparatus of claim 1 wherein the bypass isolation elements are initiated by a control signal wherein logic tests are done by scan chain.

3. The apparatus of claim 2 wherein the control signal is provided by a primary input from control circuit.

4. The apparatus of claim 2 wherein the control signal is provided by a latch.

5. The apparatus of claim 2 wherein the control signal is applied to a latch.

6. The apparatus of claim 5 wherein the latch provides the control signal to a multiplexer in each memory macro.

7. The apparatus of claim 6 wherein the control signal places the apparatus into bypass mode by selecting a scan in signal which loads logic test patterns into the BIST circuits.

8. The apparatus of claim 7 wherein after the BIST is completed the apparatus is taken out of bypass mode and results are unloaded.

9. The apparatus of claim 6 wherein the clocking system includes a memory test lock which allows a logic test pattern to be loaded and unloaded independent of the memory clock.

10. The apparatus of claim 9 wherein a signal to the clocking system is applied by an external tester to a clock multiplier and control circuit.

11. The apparatus of claim 9 wherein a signal to the clocking system is applied by an external tester to a clock generator located on the semiconductor device.

12. A method for performing simultaneous tests of logic and memory macro on a semiconductor device having logic with BIST and memory circuits comprising:
    verifying scan chain and BIST operation;
    loading BIST patterns using global clocking;
    placing the device into a bypass mode wherein the memory macro circuits are isolated from the scan chains;
    generating separate test clock signals to both memory macro circuits and logic circuits; and
    running the scan chains in simultaneous with BIST.

* * * * *